United States Patent
Kim et al.

(10) Patent No.: US 10,763,789 B2
(45) Date of Patent: Sep. 1, 2020

(54) MIXER FOR REDUCING LOCAL FREQUENCY SIGNAL GENERATED AT OUTPUT OF THE MIXER

(71) Applicant: Samsung Electronics Co., Ltd., Suwon-si (KR)

(72) Inventors: Kihyun Kim, Suwon-si (KR); Daehyun Kang, Suwon-si (KR); Hyunchul Park, Suwon-si (KR); Kyuhwan An, Suwon-si (KR); Jaesik Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/740,317

(22) Filed: Jan. 10, 2020

(65) Prior Publication Data

US 2020/0228062 A1 Jul. 16, 2020

(30) Foreign Application Priority Data

Jan. 10, 2019 (KR) .................. 10-2019-0003309

(51) Int. Cl.
*H03D 7/14* (2006.01)
*H04B 1/18* (2006.01)
*H03D 7/12* (2006.01)

(52) U.S. Cl.
CPC .................... *H03D 7/12* (2013.01)

(58) Field of Classification Search
CPC combination set(s) only.
See application file for complete search history.

(56) References Cited

U.S. PATENT DOCUMENTS 6,889,036 B2 * 5/2005 Ballweber ................. H03F 1/56
334/55
7,042,960 B2  5/2006 Kintis
(Continued)

OTHER PUBLICATIONS

Praveen M. V. et al., "An Automatic LO Leakage Calibration Method for Class-AB Power Mixer Based RF Transmitters", 2018 IEEE International Symposium on Circuits and Systems (ISCAS), May 27-30, 2018, 5 pages.
(Continued)

*Primary Examiner* — An T Luu

(57) ABSTRACT

The disclosure relates to a communication method and system for converging a 5G communication system for supporting higher data rates beyond a 4G system with an IoT technology. The disclosure may be applied to intelligent services based on the 5G communication technology and the IoT-related technology, such as smart home, smart building, smart city, smart car or connected car, healthcare, digital education, retail, security and safety-related services. The disclosure provides a mixer including a first impedance connected in parallel to a mixer output transformer and configured to remove a primary local frequency component generated at an output of the mixer, and a second impedance connected in parallel to the mixer output transformer and configured to remove a secondary local frequency component generated at the output of the mixer, wherein the first impedance operates as a series resonator in a primary local frequency band, and the second impedance operates as a parallel resonator in a secondary local frequency band.

20 Claims, 8 Drawing Sheets

(56) References Cited

U.S. PATENT DOCUMENTS

| | | | |
|---|---|---|---|
| 8,559,905 B2 | 10/2013 | Buer et al. | |
| 8,571,511 B2 * | 10/2013 | Goldfarb | H03D 7/1441 |
| | | | 455/290 |
| 2004/0113689 A1 | 6/2004 | Hajimiri et al. | |
| 2013/0035053 A1 | 2/2013 | Liao | |
| 2015/0116167 A1 | 4/2015 | Kim et al. | |
| 2016/0112226 A1 | 4/2016 | Martinez et al. | |
| 2018/0076769 A1 | 3/2018 | Mattisson et al. | |

OTHER PUBLICATIONS

International Search Report dated Apr. 23, 2020 in connection with International Patent Application No. PCT/KR2020/000443, 8 pages.

* cited by examiner

MIXER FOR REDUCING LOCAL FREQUENCY SIGNAL GENERATED AT OUTPUT OF THE MIXER

CROSS-REFERENCE TO RELATED APPLICATION

This application is based on and claims priority under 35 U.S.C. § 119 to Korean Patent Application No. 10-2019-0003309 filed on Jan. 10, 2019 in the Korean Intellectual Property Office, the disclosure of which is herein incorporated by reference in its entirety.

BACKGROUND

1. Field

The disclosure relates to a mixer that is necessary to transform a frequency band in a next-generation mobile communication system.

2. Description of Related Art

To meet the increasing demand for wireless data traffic since the deployment of 4G communication systems, efforts have been made to develop an improved 5G or pre-5G communication system. Therefore, the 5G or pre-5G communication system is also called a "beyond 4G network" communication system or a "post LTE System." Implementation of the 5G communication system in ultrahigh frequency (mmWave) bands, e.g., 60 GHz bands, is being considered in order to accomplish higher data rates. To mitigate a path loss of the radio waves and increase the transmission distance on the radio waves in the ultrahigh frequency bands, beamforming, massive multiple-input multiple-output (massive MIMO), full dimensional MIMO (FD-MIMO), array antenna, analog beamforming, and large scale antenna techniques are being discussed for 5G communication systems. In addition, in 5G communication systems, development for system network improvement is under way based on evolved small cells, advanced small cells, cloud radio access networks (cloud RANs), ultra-dense networks, device-to-device (D2D) communication, wireless backhaul, moving network, cooperative communication, coordinated multi-points (CoMP), reception-end interference cancellation, and the like. In addition, in the 5G system, hybrid FSK and QAM modulation (FQAM) and sliding window superposition coding (SWSC), as advanced coding modulation (ACM) systems, and filter bank multi-carrier (FBMC), non-orthogonal multiple access (NOMA), and sparse code multiple access (SCMA), as advanced access technologies, have been developed.

On the other hand, the Internet, which is a human centered connectivity network where humans generate and consume information, is now evolving to the Internet of things (IoT) where distributed entities, such as things, exchange and process information without human intervention. The Internet of everything (IoE), which is a combination of IoT technology and big data processing technology through connection with a cloud server, has emerged. Technology elements, such as "sensing technology", "wired/wireless communication and network infrastructure", "service interface technology", and "security technology" have been demanded for IoT implementation; therefore, technologies, such as a sensor network, machine-to-machine (M2M) communication, machine type communication (MTC) for a connection between things, are recently researched. Such an IoT environment may provide intelligent Internet technology (IT) services that create a new value for human life by collecting and analyzing data generated among connected things. IoT may be applied to a variety of fields including smart home, smart building, smart city, smart car or connected car, smart grid, health care, smart appliances, and advanced medical services through convergence and combination between existing information technology (IT) and various industrial applications.

In line with this, various attempts have been made to apply 5G communication systems to IoT networks. For example, technologies such as a sensor network, machine-to-machine (M2M) communication, and machine type communication (MTC) may be implemented by beamforming, MIMO, and array antennas, which correspond to 5G communication technology. Application of a cloud radio access network (cloud RAN) as the above-described big data processing technology may also be considered to be an example of convergence between the 5G technology and the IoT technology.

SUMMARY

In order to change a frequency through a mixer, it is required to input a local frequency to the mixer. On the other hand, due to asymmetry of circuits constituting the mixer in the process of changing a frequency band through the local frequency, the local frequency being input to the mixer may exert an influence on an output of the mixer.

In particular, due to a primary local frequency component and a secondary local frequency component, there may be a problem that a desired frequency band is unable to be acquired through the mixer.

According to an embodiment of the disclosure, a mixer transforming a frequency using a local frequency includes a first impedance connected in parallel to a mixer output transformer and configured to remove a primary local frequency component generated at an output of the mixer; and a second impedance connected in parallel to the mixer output transformer and configured to remove a secondary local frequency component generated at the output of the mixer, wherein the first impedance operates as a series resonator in a primary local frequency band, and the second impedance operates as a parallel resonator in a secondary local frequency band.

According to another embodiment of the disclosure, an electronic device including a mixer transforming a frequency using a local frequency, wherein the mixer includes a first impedance connected in parallel to a mixer output transformer and configured to remove a primary local frequency component generated at an output of the mixer; and a second impedance connected in parallel to the mixer output transformer and configured to remove a secondary local frequency component generated at the output of the mixer, wherein the first impedance operates as a series resonator in a primary local frequency band, and the second impedance operates as a parallel resonator in a secondary local frequency band.

According to an embodiment of the disclosure, the local frequency components generated at the output of the mixer can be removed. According to various embodiments, because the local frequency components generated at the output of the mixer are removed, stability of the mixer can be improved.

Effects that can be obtained in the disclosure are not limited to the above-described effects, and other unmentioned effects can be clearly understood by those of ordinary skill in the art to which the disclosure pertains from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
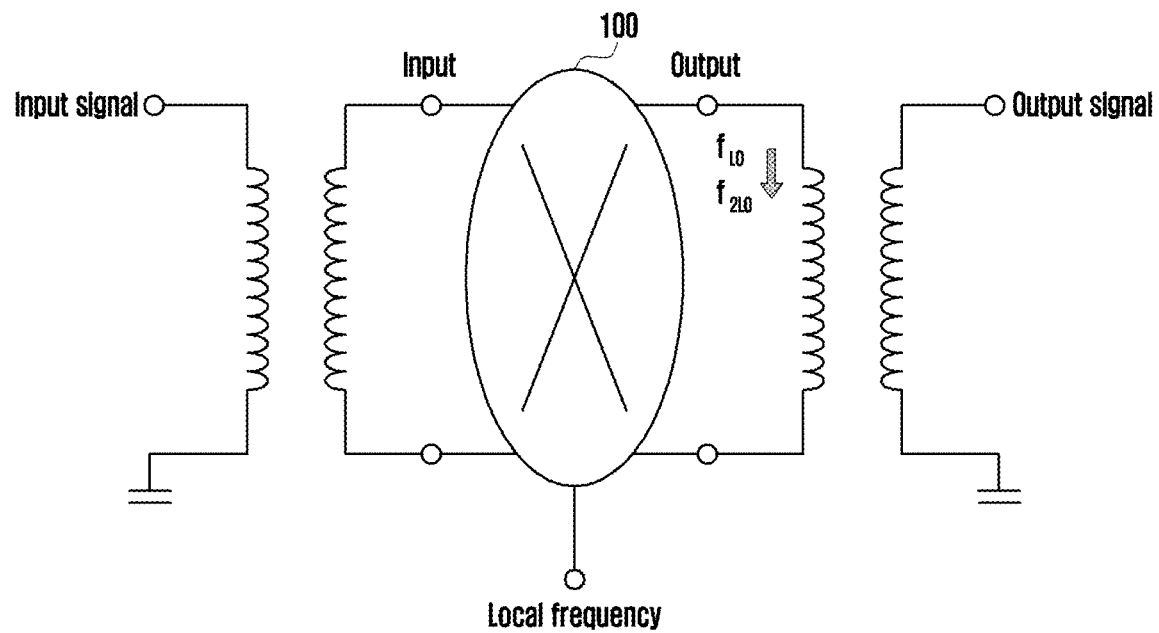
FIG. 1 illustrates a diagram explaining a local frequency component generated at an output of a mixer.

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

In explaining embodiments of the disclosure, explanation of technical contents that are well known in the art to which the disclosure pertains and are not directly related to the disclosure will be omitted. This is to transfer the subject matter of the disclosure more clearly without obscuring the same through omission of unnecessary explanations.

For the same reason, in the accompanying drawings, sizes and relative sizes of some constituent elements may be exaggerated, omitted, or briefly illustrated. Further, sizes of the respective constituent elements do not completely reflect the actual sizes thereof. In the drawings, the same drawing reference numerals are used for the same or corresponding elements across various figures.

The aspects and features of the disclosure and methods for achieving the aspects and features will be apparent by referring to the embodiments to be described in detail with reference to the accompanying drawings. However, the disclosure is not limited to the embodiments disclosed hereinafter, and it can be implemented in diverse forms. The matters defined in the description, such as the detailed construction and elements, are only specific details provided to assist those of ordinary skill in the art in a comprehensive understanding of the disclosure, and the disclosure is only defined within the scope of the appended claims. In the entire description of the disclosure, the same drawing reference numerals are used for the same elements across various figures.

In this case, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Also, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

In this case, the term "~unit", as used in an embodiment, means, but is not limited to, a software or hardware component, such as FPGA or ASIC, which performs certain tasks. However, "~unit" is not meant to be limited to software or hardware. The term "~unit" may advantageously be configured to reside on the addressable storage medium and configured to execute on one or more processors. Thus, "~unit" may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "~units" may be combined into fewer components and "~units" or further separated into additional components and "~units". Further, the components and "~units" may be implemented to operate one or more CPUs in a device or a security multimedia card. Further, in an embodiment, "~unit" may include one or more processors.

FIG. 1 illustrates a diagram explaining a local frequency component generated at an output of a mixer.

According to an embodiment, a mixer 100 may receive an input signal having a first frequency band through a transformer deployed at an input of the mixer. According to various embodiments, the mixer 100 may output an output signal having a second frequency band based on the received input signal and a local frequency. For example, the first frequency band may be an intermediate frequency, and the second frequency band may be a radio frequency.

According to an embodiment, due to asymmetry of circuits constituting the mixer 100, parts of local frequency components being input to the mixer 100 may flow to an output of the mixer. According to various embodiments, a primary local frequency $f_{LO}$ and a secondary local frequency $f_{2LO}$ may flow to the output of the mixer 100.

According to an embodiment, the primary local frequency $f_{LO}$ and the secondary local frequency $f_{2LO}$ may flow to a transformer deployed at the output of the mixer 100. According to various embodiments, by the primary local frequency $f_{LO}$ and the secondary local frequency $f_{2LO}$ flowing to the output of the mixer 100, the frequency band of the output signal intended to be output through the mixer 100 may be changed.

Figure 2:
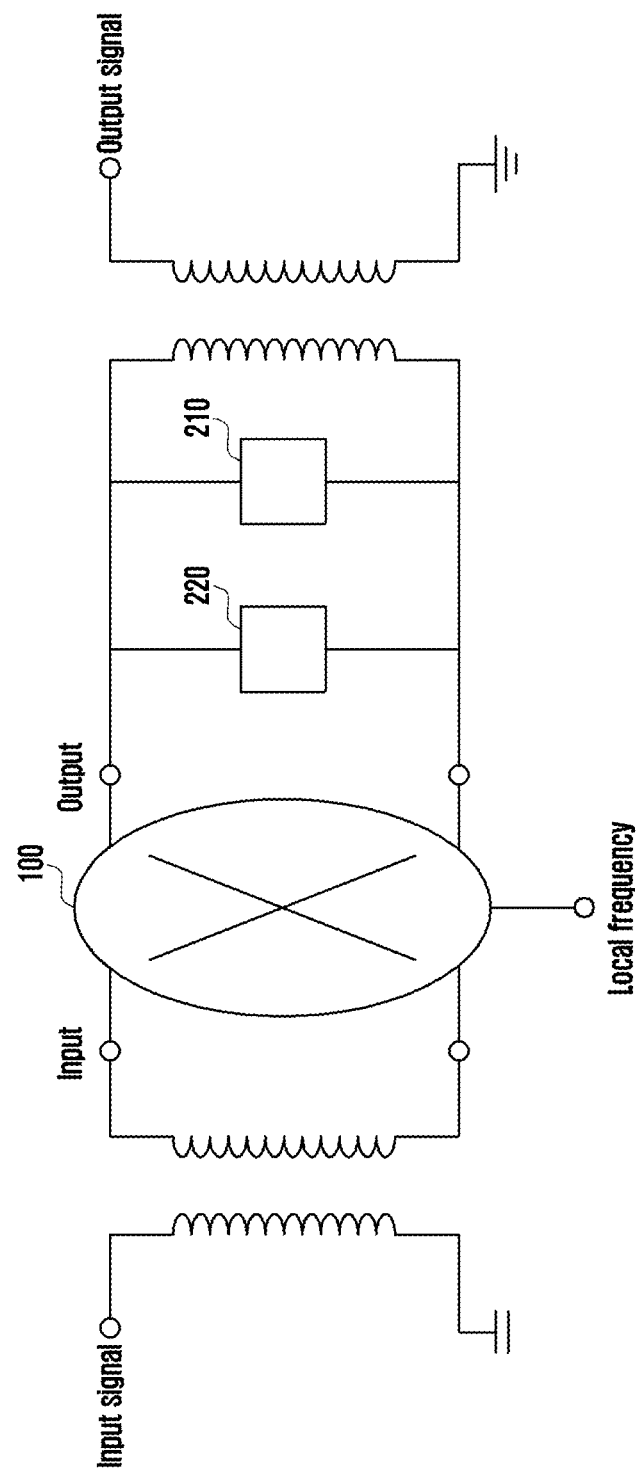
FIG. 2 illustrates a diagram of the structure of a mixer according to an embodiment of the disclosure.

FIG. 2 illustrates a diagram of the structure of a mixer according to an embodiment of the disclosure.

According to an embodiment, the mixer 100 may include a first impedance 210 connected in parallel to a mixer output transformer at an output of the mixer and configured to remove a primary local frequency component generated at the output of the mixer, and a second impedance 220 connected in parallel to the mixer output transformer and configured to remove a secondary local frequency component generated at the output of the mixer.

According to an embodiment, the first impedance 210 may operate as a series resonator in a primary local frequency band. According to various embodiments, in the primary local frequency band, the impedance value of the first impedance 210 may have a value that is close to 0. Accordingly, the primary local frequency component that flows into the output of the mixer 100 may not flow to the mixer output transformer, but it may flow to ground through the first impedance.

According to an embodiment, the second impedance 220 may operate as a parallel resonator in a secondary local frequency band. According to various embodiments, in the secondary local frequency band, the impedance value of the mixer output may have a value that is close to infinity by the second impedance 220 and the mixer output transformer. Accordingly, the secondary local frequency component that flows into the output of the mixer 100 may not flow to the mixer output transformer.

Figure 3A:
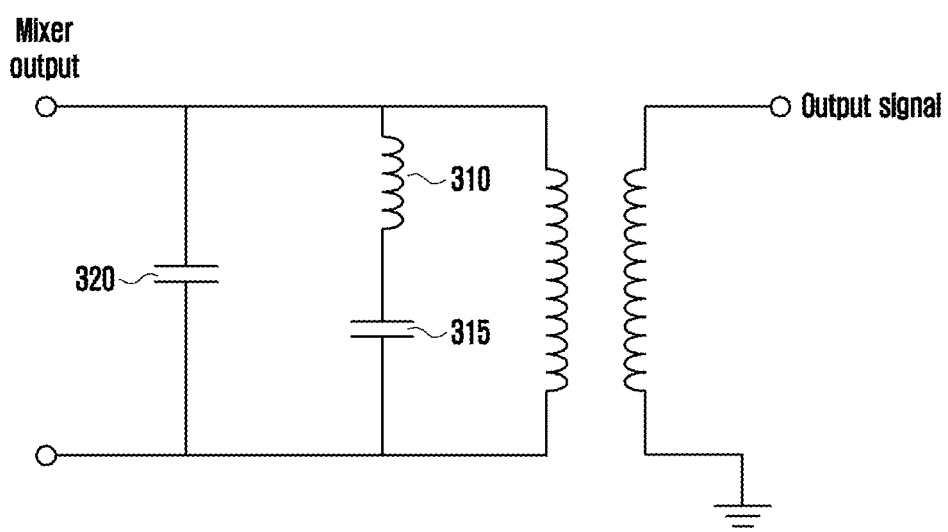
FIG. 3A illustrates a diagram of an output of a mixer according to an embodiment of the disclosure.

FIG. 3A illustrates a diagram of an output of a mixer according to an embodiment of the disclosure.

According to an embodiment, the mixer may include a first impedance connected in parallel to a mixer output transformer at an output of the mixer and configured to remove a primary local frequency component generated at the output of the mixer, and a second impedance connected in parallel to the mixer output transformer and configured to remove a secondary local frequency component generated at the output of the mixer.

According to an embodiment, the first impedance may include a first inductor 310 and a first capacitor 315 connected in series to the first inductor 310. According to various embodiments, the impedance value of the first impedance in the primary local frequency band may be lower than a first predetermined reference value. For example, the first reference value may be a value that is close to 0.

According to an embodiment, the second impedance may include a second capacitor 320. According to various embodiments, the impedance value of the second impedance in the secondary local frequency band may be higher than a second predetermined reference value. For example, the second reference value may be a value that is close to infinity (value equal to or higher than 400 ohms). According to an embodiment, a transformer deployed at the output of the mixer may operate as an inductor, and the second capacitor 320 and the mixer output transformer may operate as a parallel resonator in the secondary local frequency band.

On the other hand, although FIG. 3A illustrates only a case where the first impedance is composed of the first inductor 310 and the first capacitor 315 and the second impedance is composed of the second capacitor 320, the scope of the disclosure should not be limited thereto.

For example, the first impedance or the second impedance may include a stub or a metal line. According to various embodiments, the impedance value of the first impedance composed of the stub or metal line in the primary local frequency band may be lower than a first predetermined reference value. For example, the first reference value may be a value that is close to 0. According to an embodiment, the impedance value of the second impedance composed of the stub or metal line in the secondary local frequency band may be higher than a second predetermined reference value. For example, the second reference value may be a value that is close to infinity.

Figure 3B:
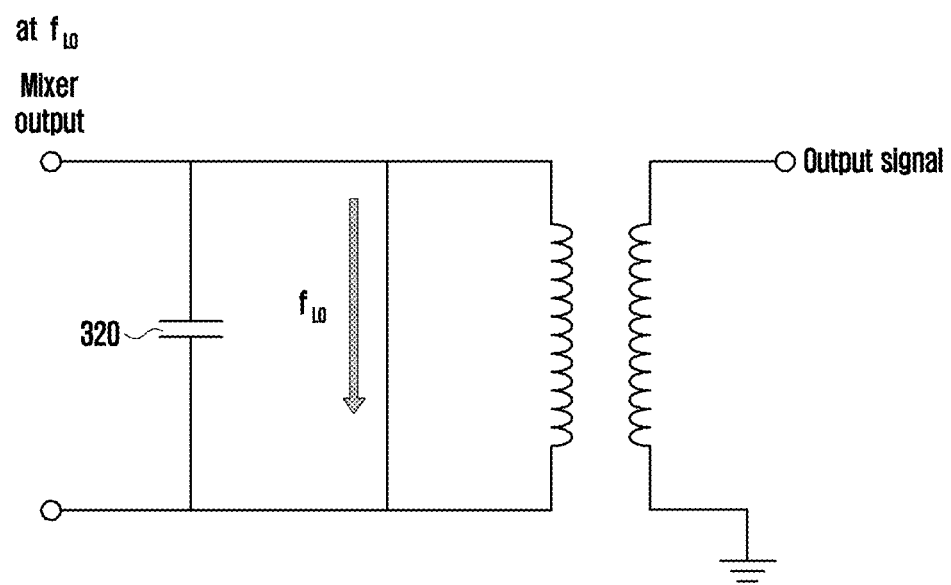
FIG. 3B illustrates a diagram of an equivalent circuit of an output of a mixer in a primary local frequency band according to an embodiment of the disclosure.

FIG. 3B illustrates a diagram of an equivalent circuit of an output of a mixer in a primary local frequency band according to an embodiment of the disclosure. More specifically, FIG. 3B illustrates an equivalent circuit of the mixer output in the primary local frequency band in the case where the mixer output circuit is configured as illustrated in FIG. 3A.

According to an embodiment, the first impedance 310 and 315 of FIG. 3A may operate as a series resonator in the primary local frequency band $f_{LO}$. According to various embodiments, in the primary local frequency band $f_{LO}$, the impedance value of the first impedance 310 and 315 of FIG. 3A may be a value that is close to 0. Accordingly, as illustrated in FIG. 3B, the first impedance 310 and 315 may be replaced by short.

According to an embodiment, the second capacitor 320 and the mixer output transformer may have specific impedance values in the primary local frequency band. According to various embodiments, the primary local frequency component that flows into the mixer output may not flow to the second capacitor 320 or the mixer output transformer, but it may flow to ground through the short line.

Figure 3C:
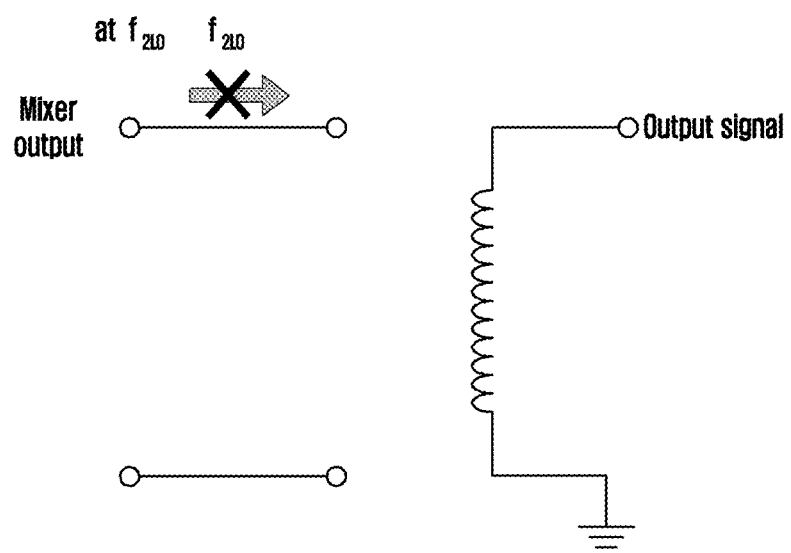
FIG. 3C illustrates a diagram of an equivalent circuit of an output of a mixer in a secondary local frequency band according to an embodiment of the disclosure.

FIG. 3C illustrates a diagram of an equivalent circuit of an output of a mixer in a secondary local frequency band according to an embodiment of the disclosure. More specifically, FIG. 3C illustrates an equivalent circuit of the mixer output in the secondary local frequency band in the case where the mixer output circuit is configured as illustrated in FIG. 3A.

According to an embodiment, the second capacitor 320 and the mixer output transformer of FIG. 3A may operate as a parallel resonator in the secondary local frequency band $f_{2LO}$. According to various embodiments, the second capacitor 320 of FIG. 3A and the mixer output transformer may have an impedance value that is close to infinity in the secondary local frequency band $f_{2LO}$. Accordingly, as illustrated in FIG. 3C, the mixer output may be replaced by open.

According to an embodiment, because the mixer output in the secondary local frequency band $f_{2LO}$ is shown as open, the secondary local frequency component that flows into the mixer output does not flow to the mixer output transformer. That is, the secondary local frequency component may not flow through the mixer output transformer.

Figure 4:
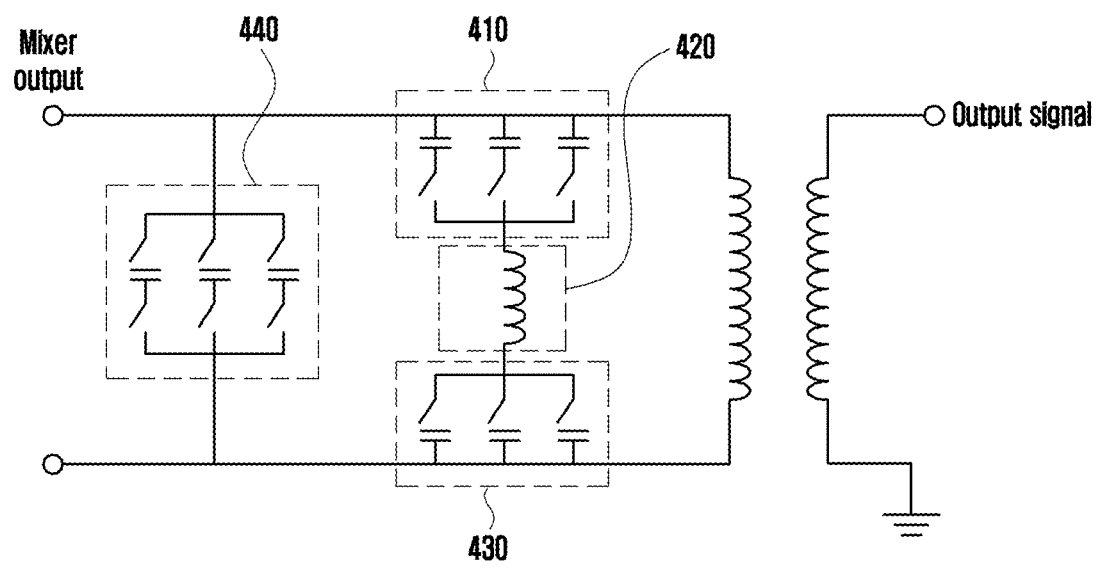
FIG. 4 illustrates a diagram of an output of a mixer including capacitor groups according to an embodiment of the disclosure.

FIG. 4 illustrates a diagram of an output of a mixer including capacitor groups according to an embodiment of the disclosure.

According to an embodiment, the mixer may include a first impedance 410, 420, and 430 connected in parallel to a mixer output transformer and configured to remove a primary local frequency component generated at the output of the mixer, and a second impedance 440 connected in parallel to the mixer output transformer and configured to remove a secondary local frequency component generated at the output of the mixer.

According to an embodiment, the first impedance may include a first capacitor group 410 including a plurality of capacitors connected in parallel to one another and switches connected in series corresponding to the respective capacitors of the first capacitor group 410, an inductor 420 electrically connected to one end of the first capacitor group, and a second capacitor group 430 including a plurality of capacitors connected in parallel to one another and switches connected in series corresponding to the respective capacitors of the second capacitor group. For example, the first capacitor group 410 and the second capacitor group 420 may be cap-banks.

According to an embodiment, by controlling the switches of the first capacitor group 410 and the second capacitor group 420, it is possible to make the first impedance including the first capacitor group 410, the inductor 420, and the second capacitor group 430 operate as a series resonator in the primary local frequency band. According to various embodiments, the first capacitor group 410 and the second capacitor group 430 are deployed at both ends of the inductor 420, and thus the first impedance can have a symmetric circuit structure.

According to an embodiment, the first impedance 410, 420, and 430 operates as a series resonator in the primary local frequency band, and thus the impedance value of the first impedance may have a value that is close to 0. According to various embodiments, the primary local frequency component flowing into the mixer output may flow to ground through the first impedance 410, 420, and 430. That is, the primary local frequency component may not flow to the mixer output transformer.

According to an embodiment, the second impedance may include a third capacitor group 440 including a plurality of capacitors connected in parallel to one another and switches connected in series corresponding to the respective capacitors of the third capacitor group. For example, the third capacitor group 440 may be a cap-bank.

According to an embodiment, by controlling the switches of the third capacitor group 440, it is possible to make the third capacitor group 440 and the mixer output transformer operate as a parallel resonator in the secondary local frequency band.

According to an embodiment, the third capacitor group 440 and the mixer output transformer operate as a parallel resonator in the secondary local frequency band, and thus the impedance value of the mixer output may have a value that is close to infinity. According to various embodiments, the secondary local frequency component flowing into the mixer output may not flow to the mixer output transformer due to the impedance value of the mixer output that is close to infinity.

On the other hand, although FIG. 4 illustrates only a symmetric circuit structure in which the first capacitor group 410, the inductor 420, and the second capacitor group 430 are successively connected as the first impedance, the scope of the disclosure should not be limited to the circuit structure as illustrated in FIG. 4. For example, the first impedance may be configured to have an asymmetric circuit structure including one capacitor group and one inductor only.

Figure 5:
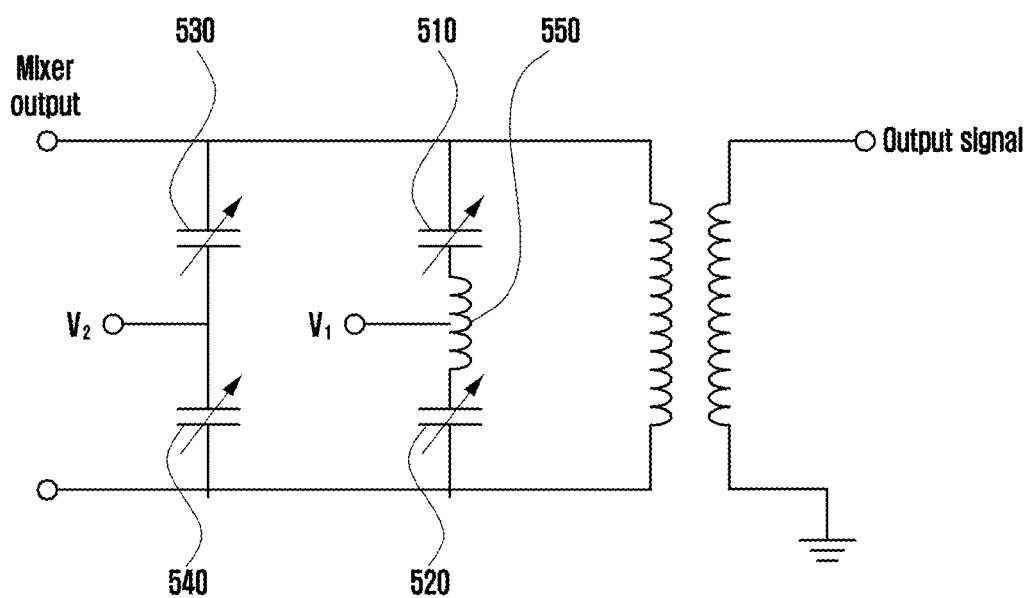
FIG. 5 illustrates a diagram of an output of a mixer including transistors according to an embodiment of the disclosure.

FIG. 5 illustrates a diagram of an output of a mixer including transistors according to an embodiment of the disclosure.

According to an embodiment, the mixer may include a first impedance connected in parallel to a mixer output transformer and configured to remove a primary local frequency component generated at the output of the mixer, and a second impedance connected in parallel to the mixer output transformer and configured to remove a secondary local frequency component generated at the output of the mixer.

According to an embodiment, the first impedance may include a first transistor 510 having the capacitance characteristics being changed in accordance with a first control voltage $v_1$, an inductor 550 electrically connected to one end of the first transistor 510, and a second transistor 520 electrically connected to one end of the inductor 550 and having the capacitance characteristics being changed in accordance with the first control voltage $v_1$. According to various embodiments, the second impedance may include a third transistor 530 having the capacitance characteristics being changed in accordance with a second control voltage $v_2$, and a fourth transistor 540 electrically connected to one end of the third transistor 530 and having the capacitance characteristics being changed in accordance with the second control voltage $v_2$.

According to an embodiment, by controlling the first control voltage $v_1$, it is possible to make the first impedance including the first transistor 510, the inductor 550, and the second transistor 520 operate as a series resonator in the primary local frequency band. According to various embodiments, the first transistor 510 and the second transistor 520 are deployed at both ends of the inductor 550, and thus the first impedance can have a symmetric circuit structure.

According to an embodiment, the first impedance 510, 520, and 550 operates as a series resonator in the primary local frequency band, and thus the impedance value of the first impedance may have a value that is close to 0. According to various embodiments, the primary local frequency component flowing into the mixer output may flow to ground through the first impedance 510, 520, and 530. That is, the primary local frequency component may not flow to the mixer output transformer.

According to an embodiment, by controlling the second control voltage $v_2$, it is possible to make the second impedance including the third transistor 530 and the fourth transistor 540 and the mixer output transformer operate as a parallel resonator in the secondary local frequency band. According to various embodiments, the second impedance is composed of the third transistor 530 and the fourth transistor 540, and thus the second impedance can have a symmetric circuit structure.

According to an embodiment, the second impedance and the mixer output transformer operates as a parallel resonator in the secondary local frequency band, and thus the impedance value of the mixer output may have a value that is close to infinity. According to various embodiments, the secondary local frequency component flowing into the mixer output may not flow to the mixer output transformer due to the impedance value of the mixer output that is close to infinity.

According to an embodiment, the first impedance and the second impedance may be composed of varactors. According to various embodiments, the first impedance may include a first varactor having the capacitance characteristics being changed in accordance with a third control voltage, an inductor electrically connected to one end of the first varactor, and a second varactor electrically connected to one end of the inductor and having the capacitance characteristics being changed in accordance with the third control voltage.

According to an embodiment, the second impedance may include a third varactor having the capacitance characteristics being changed in accordance with a fourth control voltage, and a fourth varactor electrically connected to one end of the third varactor and having the capacitance characteristics being changed in accordance with the fourth control voltage. The circuit operation in the case where the first impedance and the second impedance are composed of varactors may be equal to or similar to the circuit operation in the case where the first impedance and the second impedance are composed of transistors. That is, the first impedance may operate as a series resonator in the primary local frequency band, and the second impedance and the mixer output transformer may operate as a parallel resonator in the secondary local frequency band.

Figure 6:
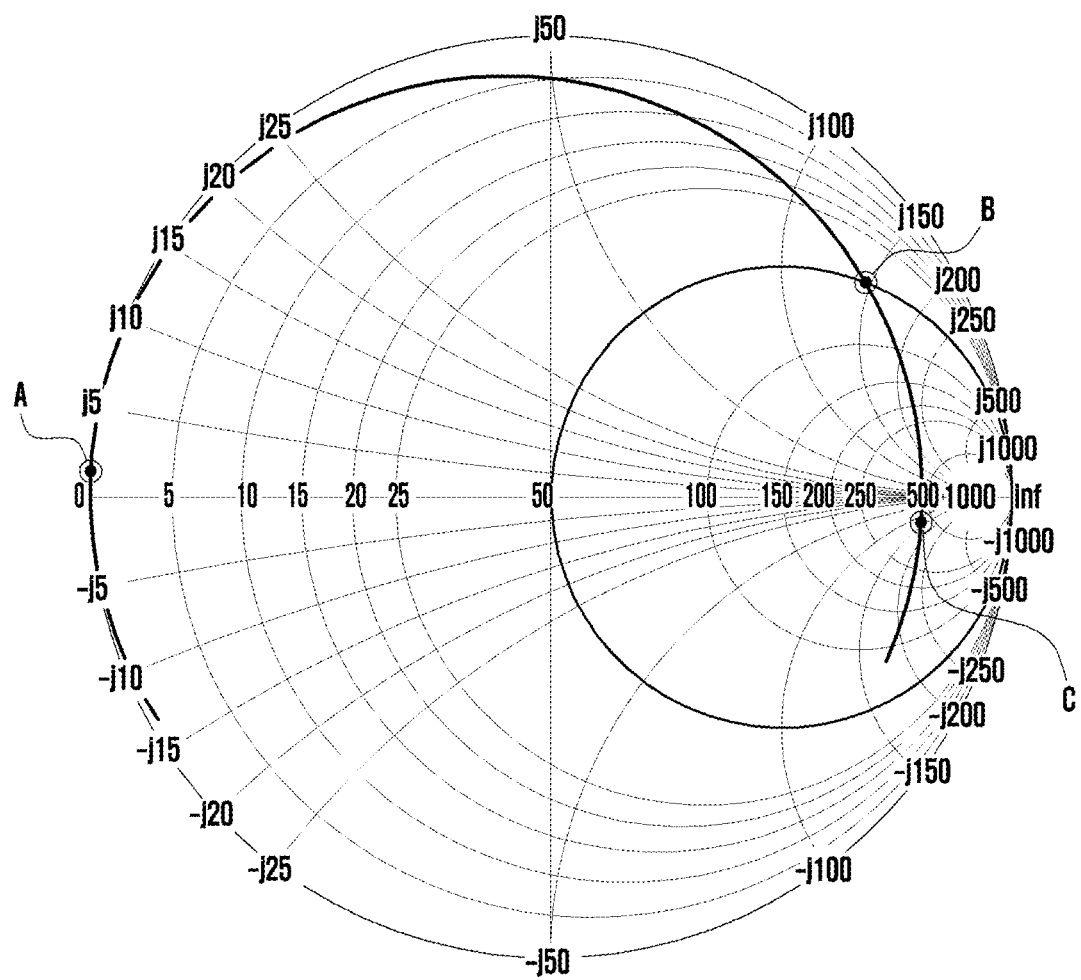
FIG. 6 illustrates a diagram of a Smith chart according to an embodiment of the disclosure.

FIG. 6 illustrates a Smith chart according to an embodiment of the disclosure.

According to the disclosure, the impedance value of the first impedance may be a value that is close to 0 in the primary local frequency band. Further, the impedance value by the second impedance and the mixer output transformer may be a value that is close to infinity in the secondary local frequency band.

FIG. 6 illustrates a Smith chart for confirming the impedance values in the primary local frequency band and the secondary local frequency band. In the Smith chart as illustrated in FIG. 6, as the impedance value is deployed in an area that is close to 0, it means that the impedance value becomes close to 0, whereas as the impedance value is deployed in an area that is close to infinity.

According to an embodiment, A of FIG. 6 may mean the impedance value of the first impedance in the primary local frequency band. That is, the first impedance has a very low impedance value in the primary local frequency band, and thus the primary local frequency may not flow to the mixer output transformer, but it may flow to ground through the first impedance.

According to an embodiment, B of FIG. 6 may mean the impedance value as seen from the mixer input to the mixer output. According to various embodiments, as seen from the mixer output to the mixer input, the impedance value may be deployed in a right below area of the Smith chart. Accordingly, as seen from the mixer input to the mixer output for conjugate matching, the impedance value may be deployed in B that is a right upper area of the Smith chart.

According to an embodiment, C of FIG. 6 may mean the impedance value of the mixer output in the secondary local frequency band. That is, the second impedance has a very high impedance value in the secondary local frequency band, and thus the secondary local frequency may not flow to the mixer output transformer.

According to an embodiment, a mixer transforming a frequency using a local frequency may include a first impedance connected in parallel to a mixer output transformer and configured to remove a primary local frequency component generated at an output of the mixer, and a second impedance connected in parallel to the mixer output transformer and configured to remove a secondary local frequency component generated at the output of the mixer, wherein the first impedance operates as a series resonator in a primary local frequency band, and the second impedance operates as a parallel resonator in a secondary local frequency band.

According to an embodiment, the first impedance may include a first inductor and a first capacitor connected in series to the first inductor, and an impedance value of the first impedance in the primary local frequency band may be lower than a first predetermined reference value.

According to an embodiment, the second impedance may include a second capacitor, and an impedance value of the second impedance in the secondary local frequency band may be higher than a second predetermined reference value.

According to an embodiment, the first impedance or the second impedance may include a stub or a metal line, and the impedance value of the first impedance in the primary local frequency band may be lower than a first predetermined reference value, and an impedance value of the second impedance in the secondary local frequency band may be higher than a second predetermined reference value.

According to an embodiment, the first impedance may include at least one capacitor group and a second inductor, and the at least one capacitor group may include a plurality of capacitors connected in parallel to one another and switches connected in series corresponding to the respective capacitors of the at least one capacitor group.

According to an embodiment, the first impedance may include a first capacitor group including a plurality of capacitors connected in parallel to one another and switches connected in series corresponding to the respective capacitors of the first capacitor group, a third inductor electrically connected to one end of the first capacitor group, and a second capacitor group including a plurality of capacitors connected in parallel to one another and switches connected in series corresponding to the respective capacitors of the second capacitor group and electrically connected to one end of the third inductor.

According to an embodiment, the second impedance may include a third capacitor group including a plurality of capacitors connected in parallel to one another and switches connected in series corresponding to the respective capacitors of the third capacitor group.

According to an embodiment, the first impedance may include a first transistor having capacitance characteristics being changed in accordance with a first control voltage, a fourth inductor electrically connected to one end of the first transistor, and a second transistor electrically connected to one end of the fourth inductor and having capacitance characteristics being changed in accordance with the first control voltage, and the second impedance may include a third transistor having capacitance characteristics being changed in accordance with a second control voltage, and a fourth transistor electrically connected to one end of the third transistor and having capacitance characteristics being changed in accordance with the second control voltage.

According to an embodiment, the first control voltage may be supplied to the first transistor and the second transistor through a first resistor having a specific value, and the second control voltage may be supplied to the third transistor and the fourth transistor through a second resistor having a specific value.

According to an embodiment, the first impedance may include a first varactor having capacitance characteristics being changed in accordance with a third control voltage, a fifth inductor electrically connected to one end of the first varactor, and a second varactor electrically connected to one end of the fifth inductor, and having capacitance characteristics being changed in accordance with the third control voltage, and the second impedance may include a third varactor having capacitance characteristics being changed in accordance with a fourth control voltage, and a fourth varactor electrically connected to one end of the third varactor and having capacitance characteristics being changed in accordance with the fourth control voltage.

According to an embodiment, an electronic device including a mixer transforming a frequency using a local frequency, wherein the mixer includes a first impedance connected in parallel to a mixer output transformer and configured to remove a primary local frequency component generated at an output of the mixer; and a second impedance connected in parallel to the mixer output transformer and configured to remove a secondary local frequency component generated at the output of the mixer, wherein the first impedance operates as a series resonator in a primary local frequency band, and the second impedance operates as a parallel resonator in a secondary local frequency band.

According to an embodiment, the first impedance may include a first inductor and a first capacitor connected in series to the first inductor, and an impedance value of the first impedance in the primary local frequency band may be lower than a first predetermined reference value.

According to an embodiment, the second impedance may include a second capacitor, and an impedance value of the second impedance in the secondary local frequency band may be higher than a second predetermined reference value.

According to an embodiment, the first impedance or the second impedance may include a stub or a metal line, and the impedance value of the first impedance in the primary local frequency band may be lower than a first predetermined reference value, and an impedance value of the second impedance in the secondary local frequency band may be higher than a second predetermined reference value.

According to an embodiment, the first impedance may include at least one capacitor group and a second inductor, and the at least one capacitor group may include a plurality of capacitors connected in parallel to one another and switches connected in series corresponding to the respective capacitors of the at least one capacitor group.

According to an embodiment, the first impedance may include a first capacitor group including a plurality of capacitors connected in parallel to one another and switches connected in series corresponding to the respective capacitors of the first capacitor group, a third inductor electrically connected to one end of the first capacitor group, and a second capacitor group including a plurality of capacitors connected in parallel to one another and switches connected in series corresponding to the respective capacitors of the second capacitor group and electrically connected to one end of the third inductor.

According to an embodiment, the second impedance may include a third capacitor group including a plurality of capacitors connected in parallel to one another and switches connected in series corresponding to the respective capacitors of the third capacitor group.

According to an embodiment, the first impedance may include a first transistor having capacitance characteristics being changed in accordance with a first control voltage, a fourth inductor electrically connected to one end of the first transistor, and a second transistor electrically connected to one end of the fourth inductor and having capacitance characteristics being changed in accordance with the first control voltage, and the second impedance may include a third transistor having capacitance characteristics being changed in accordance with a second control voltage, and a fourth transistor electrically connected to one end of the third transistor and having capacitance characteristics being changed in accordance with the second control voltage.

According to an embodiment, the first control voltage may be supplied to the first transistor and the second transistor through a first resistor having a specific value, and the second control voltage may be supplied to the third transistor and the fourth transistor through a second resistor having a specific value.

According to an embodiment, the first impedance may include a first varactor having capacitance characteristics being changed in accordance with a third control voltage, a fifth inductor electrically connected to one end of the first varactor, and a second varactor electrically connected to one end of the fifth inductor, and having capacitance characteristics being changed in accordance with the third control voltage, and the second impedance may include a third varactor having capacitance characteristics being changed in accordance with a fourth control voltage, and a fourth varactor electrically connected to one end of the third varactor and having capacitance characteristics being changed in accordance with the fourth control voltage.

Although the present disclosure has been described with various embodiments, various changes and modifications may be suggested to one skilled in the art. It is intended that the present disclosure encompass such changes and modifications as fall within the scope of the appended claims.

What is claimed is:

1. A mixer transforming a frequency using a local frequency, the mixer comprising:
   a first impedance connected in parallel to a mixer output transformer and configured to remove a primary local frequency component generated at an output of the mixer; and
   a second impedance connected in parallel to the mixer output transformer and configured to remove a secondary local frequency component generated at the output of the mixer,
   wherein the first impedance operates as a series resonator in a primary local frequency band, and the second impedance operates as a parallel resonator in a secondary local frequency band.

2. The mixer of claim 1, wherein the first impedance comprises a first inductor and a first capacitor connected in series to the first inductor, and an impedance value of the first impedance in the primary local frequency band is lower than a first predetermined reference value.

3. The mixer of claim 1, wherein the second impedance comprises a second capacitor, and an impedance value of the second impedance in the secondary local frequency band is higher than a second predetermined reference value.

4. The mixer of claim 1, wherein the first impedance or the second impedance comprises a stub or a metal line, and an impedance value of the first impedance in the primary local frequency band is lower than a first predetermined reference value, and an impedance value of the second impedance in the secondary local frequency band is higher than a second predetermined reference value.

5. The mixer of claim 1, wherein the first impedance comprises at least one capacitor group and a second inductor, and the at least one capacitor group includes a plurality of capacitors connected in parallel to one another and switches connected in series corresponding to respective capacitors of the at least one capacitor group.

6. The mixer of claim 1, wherein the first impedance comprises:
   a first capacitor group including a plurality of capacitors connected in parallel to one another and switches connected in series corresponding to respective capacitors of the first capacitor group;
   a third inductor electrically connected to one end of the first capacitor group; and
   a second capacitor group including a plurality of capacitors connected in parallel to one another and switches connected in series corresponding to respective capacitors of the second capacitor group, and electrically connected to one end of the third inductor.

7. The mixer of claim 6, wherein the second impedance comprises a third capacitor group including a plurality of capacitors connected in parallel to one another and switches connected in series corresponding to respective capacitors of the third capacitor group.

8. The mixer of claim 1, wherein the first impedance includes:
   a first transistor having capacitance characteristics being changed in accordance with a first control voltage;
   a fourth inductor electrically connected to one end of the first transistor; and
   a second transistor electrically connected to one end of the fourth inductor, and having capacitance characteristics being changed in accordance with the first control voltage, and
   the second impedance includes:
   a third transistor having capacitance characteristics being changed in accordance with a second control voltage; and
   a fourth transistor electrically connected to one end of the third transistor, and having capacitance characteristics being changed in accordance with the second control voltage.

9. The mixer of claim 8, wherein the first control voltage is supplied to the first transistor and the second transistor through a first resistor having a specific value, and the second control voltage is supplied to the third transistor and the fourth transistor through a second resistor having a specific value.

10. The mixer of claim 1, wherein the first impedance includes:
    a first varactor having capacitance characteristics being changed in accordance with a third control voltage;
    a fifth inductor electrically connected to one end of the first varactor; and
    a second varactor electrically connected to one end of the fifth inductor, and having capacitance characteristics being changed in accordance with the third control voltage, and the second impedance includes:
    a third varactor having capacitance characteristics being changed in accordance with a fourth control voltage; and
    a fourth varactor electrically connected to one end of the third varactor, and having capacitance characteristics being changed in accordance with the fourth control voltage.

11. An electronic device including a mixer transforming a frequency using a local frequency, the mixer comprising:
    a first impedance connected in parallel to a mixer output transformer and configured to remove a primary local frequency component generated at an output of the mixer; and
    a second impedance connected in parallel to the mixer output transformer and configured to remove a secondary local frequency component generated at the output of the mixer,
    wherein the first impedance operates as a series resonator in a primary local frequency band, and the second impedance operates as a parallel resonator in a secondary local frequency band.

12. The electronic device of claim 11, wherein the first impedance comprises a first inductor and a first capacitor connected in series to the first inductor, and an impedance value of the first impedance in the primary local frequency band is lower than a first predetermined reference value.

13. The electronic device of claim 11, wherein the second impedance comprises a second capacitor, and an impedance value of the second impedance in the secondary local frequency band is higher than a second predetermined reference value.

14. The electronic device of claim 11, wherein the first impedance or the second impedance comprises a stub or a metal line, and an impedance value of the first impedance in the primary local frequency band is lower than a first predetermined reference value, and an impedance value of the second impedance in the secondary local frequency band is higher than a second predetermined reference value.

15. The electronic device of claim 11, wherein the first impedance comprises at least one capacitor group and a second inductor, and the at least one capacitor group includes a plurality of capacitors connected in parallel to one another and switches connected in series corresponding to respective capacitors of the at least one capacitor group.

16. The electronic device of claim 11, wherein the first impedance comprises:
   a first capacitor group including a plurality of capacitors connected in parallel to one another and switches connected in series corresponding to respective capacitors of the first capacitor group;
   a third inductor electrically connected to one end of the first capacitor group; and
   a second capacitor group including a plurality of capacitors connected in parallel to one another and switches connected in series corresponding to respective capacitors of the second capacitor group, and electrically connected to one end of the third inductor.

17. The electronic device of claim 16, wherein the second impedance comprises a third capacitor group including a plurality of capacitors connected in parallel to one another and switches connected in series corresponding to respective capacitors of the third capacitor group.

18. The electronic device of claim 11, wherein the first impedance includes:
   a first transistor having capacitance characteristics being changed in accordance with a first control voltage;
   a fourth inductor electrically connected to one end of the first transistor; and
   a second transistor electrically connected to one end of the fourth inductor, and having capacitance characteristics being changed in accordance with the first control voltage, and
   the second impedance includes:
   a third transistor having capacitance characteristics being changed in accordance with a second control voltage; and
   a fourth transistor electrically connected to one end of the third transistor, and having capacitance characteristics being changed in accordance with the second control voltage.

19. The electronic device of claim 18, wherein the first control voltage is supplied to the first transistor and the second transistor through a first resistor having a specific value, and the second control voltage is supplied to the third transistor and the fourth transistor through a second resistor having a specific value.

20. The electronic device of claim 11, wherein the first impedance includes:
   a first varactor having capacitance characteristics being changed in accordance with a third control voltage;
   a fifth inductor electrically connected to one end of the first varactor; and
   a second varactor electrically connected to one end of the fifth inductor, and having capacitance characteristics being changed in accordance with the third control voltage, and
   the second impedance includes:
   a third varactor having capacitance characteristics being changed in accordance with a fourth control voltage; and
   a fourth varactor electrically connected to one end of the third varactor, and having capacitance characteristics being changed in accordance with the fourth control voltage.

* * * * *